(12) United States Patent
Nourbakhsh et al.

(10) Patent No.: US 11,830,824 B2
(45) Date of Patent: Nov. 28, 2023

(54) EDGE PROTECTION ON SEMICONDUCTOR SUBSTRATES

(71) Applicant: Applied Materials, Inc., Santa Clara, CA (US)

(72) Inventors: Amirhasan Nourbakhsh, Albany, NY (US); Lan Yu, Albany, NY (US); Joseph F. Salfelder, Pleasant Valley, NY (US); Ki Cheol Ahn, Watervliet, NY (US); Tyler Sherwood, Fonda, NY (US); Siddarth Krishnan, San Jose, CA (US); Michael Jason Fronckowiak, Troy, NY (US); Xing Chen, Dublin, CA (US)

(73) Assignee: Applied Materials, Inc., Santa Clara, CA (US)

(*) Notice: Subject to any disclaimer, the term of this patent is extended or adjusted under 35 U.S.C. 154(b) by 124 days.

(21) Appl. No.: 17/214,411

(22) Filed: Mar. 26, 2021

(65) Prior Publication Data
US 2022/0310531 A1 Sep. 29, 2022

(51) Int. Cl.
*H01L 23/00* (2006.01)
*H01L 21/304* (2006.01)
(Continued)

(52) U.S. Cl.
CPC .......... *H01L 23/562* (2013.01); *H01L 21/304* (2013.01); *H01L 21/3086* (2013.01); *H01L 21/31111* (2013.01)

(58) Field of Classification Search
CPC . H01L 23/562; H01L 21/304; H01L 21/3086; H01L 21/31111; H01L 21/3083
See application file for complete search history.

(56) References Cited

U.S. PATENT DOCUMENTS

2012/0094502 A1* 4/2012 Shin ................. H01J 37/32376
438/758
2013/0029475 A1* 1/2013 Tsukamoto ....... H01L 21/02236
438/459
(Continued)

FOREIGN PATENT DOCUMENTS

CN  107004698 A  8/2017
CN  111540750 A  8/2020
(Continued)

OTHER PUBLICATIONS

Application No. PCT/US2022/020500, International Search Report and Written Opinion, dated Jul. 6, 2022, 10 pages.
(Continued)

*Primary Examiner* — Thanh T Nguyen
(74) *Attorney, Agent, or Firm* — Kilpatrick Townsend & Stockton LLP

(57) ABSTRACT

Exemplary methods of processing a semiconductor substrate may include forming a layer of dielectric material on the semiconductor substrate. The methods may include performing an edge exclusion removal of the layer of dielectric material. The methods may include forming a mask material on the semiconductor substrate. The mask material may contact the dielectric material at an edge region of the semiconductor substrate. The methods may include patterning an opening in the mask material overlying a first surface of the semiconductor substrate. The methods may include etching one or more trenches through the semiconductor substrate.

17 Claims, 7 Drawing Sheets

(51) Int. Cl.
   *H01L 21/308*   (2006.01)
   *H01L 21/311*   (2006.01)

(56) References Cited

U.S. PATENT DOCUMENTS

2015/0287632 A1* 10/2015 Gao .................. H01L 21/76802
                                                                  438/107
2017/0309724 A1* 10/2017 Jeon ................ H01L 21/823431

FOREIGN PATENT DOCUMENTS

KR    100687852 B1    2/2007
TW    200702399 A     1/2007

OTHER PUBLICATIONS

Charavel R., et al. "Wafer Bevel Protection During Deep Reactive Ion Etching", IEEE Transactions on Semiconductor Manufacturing, vol. 24, Issue 2, ( year 2011): 358-365, DOI:10.1109/TSM.2011.2106522.

* cited by examiner

EDGE PROTECTION ON SEMICONDUCTOR SUBSTRATES

TECHNICAL FIELD

The present technology relates to semiconductor processes and products. More specifically, the present technology relates to producing semiconductor structures and the devices formed.

BACKGROUND

Integrated circuits are made possible by processes which produce intricately patterned material layers on substrate surfaces. Producing patterned material on a substrate requires controlled methods for deposition and removal of materials. However, with new device designs, producing high quality layers of material may be challenging.

Thus, there is a need for improved systems and methods that can be used to produce high quality devices and structures. These and other needs are addressed by the present technology.

SUMMARY

Exemplary methods of processing a semiconductor substrate may include forming a layer of dielectric material on the semiconductor substrate. The methods may include performing an edge exclusion removal of the layer of dielectric material. The methods may include forming a mask material on the semiconductor substrate. The mask material may contact the dielectric material at an edge region of the semiconductor substrate. The methods may include patterning an opening in the mask material overlying a first surface of the semiconductor substrate. The methods may include etching one or more trenches through the semiconductor substrate.

In some embodiments, the edge exclusion removal may include substantially removing the layer of dielectric material from an interior region of the semiconductor substrate. The edge exclusion removal may include maintaining an amount of the layer of dielectric material along an exterior region of the semiconductor substrate. The dielectric material may be maintained about the semiconductor substrate a radial distance of less than or about 10 mm inward from an exterior edge of the semiconductor substrate. The methods may include, subsequent forming the mask material, performing an edge bead removal of the mask material about an edge region of the semiconductor substrate. The dielectric material and the mask material may be or include an oxide. Forming a layer of dielectric material may include forming one or more bilayers of dielectric material. The bilayers of dielectric material may include a first layer of dielectric material characterized by a tensile stress. The bilayers of dielectric material may include a second layer of dielectric material characterized by a compressive stress. The one or more trenches may be characterized by a depth of greater than or about 10 μm. the dielectric material may be formed to a thickness of greater than or about 1 μm. The methods may include performing a backside grinding operation. The backside grinding operation may reduce a thickness of the semiconductor substrate to less than or about 300 μm. Etching the one or more trenches may reduce a thickness of the semiconductor substrate within the edge region by less than or about 50 μm.

Some embodiments of the present technology may encompass methods of processing a semiconductor substrate. The methods may include forming a first layer of dielectric material on the semiconductor substrate. The first layer of dielectric material may include a bilayer of dielectric material. The bilayer of dielectric material may include a first layer of dielectric material characterized by a tensile stress. The bilayer of dielectric material may include a second layer of dielectric material characterized by a compressive stress. The methods may include annealing the bilayer of dielectric material. The methods may include performing an edge exclusion removal of the bilayer of dielectric material. The edge exclusion removal may include substantially removing the bilayer of dielectric material from an interior region of the semiconductor substrate. The edge exclusion may include maintaining an amount of the bilayer of dielectric material along an exterior region of the semiconductor substrate.

In some embodiments, the bilayer of dielectric material may be maintained about the semiconductor substrate a radial distance of less than or about 10 mm inward from an exterior edge of the semiconductor substrate. The methods may include, subsequent annealing the first layer of dielectric material, forming a second layer of dielectric material on the bilayer of dielectric material. The second layer of dielectric material may include a second bilayer of dielectric material. The second bilayer of dielectric material may include a first layer of dielectric material characterized by a tensile stress. The second bilayer of dielectric material may include a second layer of dielectric material characterized by a compressive stress. The methods may include, prior to forming the bilayer of dielectric material, forming an etch stop layer along the semiconductor substrate. The methods may include forming a mask material on the semiconductor substrate. The mask material may contact the bilayer of dielectric material at an edge region of the semiconductor substrate. The methods may include patterning an opening in the mask material overlying a first surface of the semiconductor substrate. The methods may include etching one or more trenches through the semiconductor substrate. The methods may include, subsequent forming the mask material, performing an edge bead removal of the mask material about an edge region of the semiconductor substrate. Each layer of the bilayer of dielectric material may be characterized by a thickness of greater than or about 0.5 μm. The methods may include performing a backside grinding operation. The backside grinding operation may reduce a thickness of the semiconductor substrate to less than or about 300 μm.

Some embodiments of the present technology may encompass semiconductor structures. The structures may include a semiconductor substrate. The structures may include an edge protection layer extending circumferentially about an edge region and bevel region of the semiconductor substrate. The semiconductor substrate may be exposed through the edge protection layer about an interior region of the semiconductor substrate. The edge protection layer may include a first bilayer of dielectric material. The first bilayer of dielectric material may include a first layer of dielectric material characterized by a tensile stress. The first bilayer of dielectric material may include a second layer of dielectric material characterized by a compressive stress.

In some embodiments, the structure may include an etch stop layer formed between the first bilayer of dielectric material and the semiconductor substrate. The edge protection layer may include a second bilayer of dielectric material. The second bilayer of dielectric material may include a first layer of dielectric material characterized by a tensile stress. The second bilayer of dielectric material may include a second layer of dielectric material characterized by a compressive stress. The edge protection layer may be characterized by a thickness of greater than or about 3 μm.

Such technology may provide numerous benefits over conventional systems and techniques. For example, the processes may protect edge and bevel regions from etching during semiconductor processing. Additionally, the processes may facilitate production of ultra-thin wafers by preventing edge and bevel damage as well as wafer breakage. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
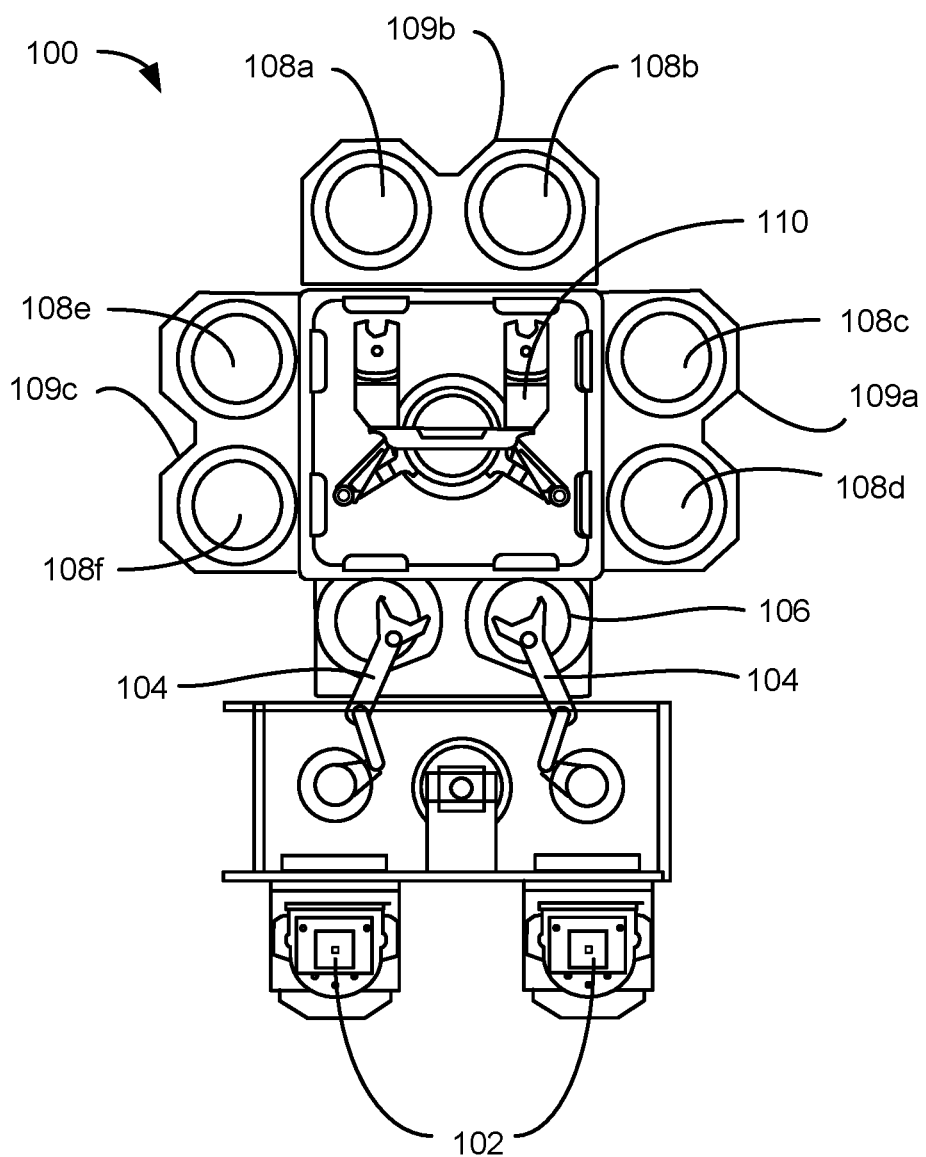
FIG. 1 shows a top plan view of one embodiment of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As devices produced in semiconductor processing continue to shrink, while layers and processing becomes more complex, uniformity, material quality, process control, and repeatability are becoming more challenging from process to process. For example, in power devices, among many other structure, increased via depth during formation operations may be required. However, as the depth of trench formation increases, wafer loss may increase. Many lithographic technologies require edge regions and bevel regions of the substrate to remain free of resist materials. While these technologies are progressing to allow edge regions to be patterned, far edge and bevel regions on the substrate may be exposed to removal during lithographic pattern transfer.

For deep trench formation, among other removal or etching processes, exposure of the edge region may cause excessive loss of substrate material in the edge regions. For example, during trench formation where multiple trenches may be formed, due to the density of the patterning, the etching of the substrate for the trenches may be relatively slow. However, at the exposed edge regions, the fully exposed open area may etch at a much faster rate than in the interior region, which may cause removal at two, three, four, or more times the rate compared to the trench formation. This may cause a number of issues with the substrate. For example, edge reduction may prevent downstream processes, such as wafer thinning operations including backside grinding. Additionally, bevel damage may lead to further substrate damage and loss when in contact with processing system robots, and may develop chipping that can result in substrate breakage in downstream processes.

The present technology may overcome these issues by forming one or more layers of material on a bevel and/or edge region of a semiconductor substrate. By producing an edge protection layer of material, processing may continue in an interior region of the wafer, while ensuring limited or reduced losses at the edge and/or bevel region. Although the remaining disclosure will routinely identify specific structures, such as power devices, for which the present structures and methods may be employed, it will be readily understood that the systems and methods are equally applicable to any number of structures and devices that may benefit from the formation of an edge protection layer on a semiconductor substrate. For example, during wafer transfer and bonding, forming an edge protection layer according to embodiments of the present technology may further protect thin substrates, which may increase device yield by limiting edge and bevel effects. Accordingly, the technology should not be considered to be so limited as for use with any particular structures alone. Moreover, although an exemplary tool system will be described to provide foundation for the present technology, it is to be understood that the present technology can be produced in any number of semiconductor processing chambers and tools that may perform some or all of the operations to be described.

FIG. 1 shows a top plan view of one embodiment of a processing system 100 of deposition, etching, baking, and curing chambers that may be included or configured according to some embodiments of the present technology. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition, atomic layer deposition, chemical vapor deposition, physical vapor deposition, etch, pre-clean, anneal, plasma processing, degas, orientation, and other substrate processes.

The substrate processing chambers 108a-f may include one or more system components for depositing, annealing, curing and/or etching a material film on the substrate or wafer. In one configuration, two pairs of the processing chambers, for example 108c-d and 108e-f, may be used to deposit material on the substrate, and the third pair of processing chambers, for example 108a-b, may be used to cure, anneal, or treat the deposited films. In another configuration, all three pairs of chambers, for example 108a-f, may be configured to both deposit and cure a film on the substrate. Any one or more of the processes described may be carried out in additional chambers separated from the fabrication system shown in different embodiments. It will be appreciated that additional configurations of deposition, etching, annealing, and curing chambers for material films are contemplated by system 100. Additionally, any number of other processing systems may be utilized with the present technology, which may incorporate chambers for performing any of the specific operations. In some embodiments, chamber systems which may provide access to multiple processing chambers while maintaining a vacuum environment in various sections, such as the noted holding and transfer areas, may allow operations to be performed in multiple chambers while maintaining a particular vacuum environment between discrete processes.

Figure 2:
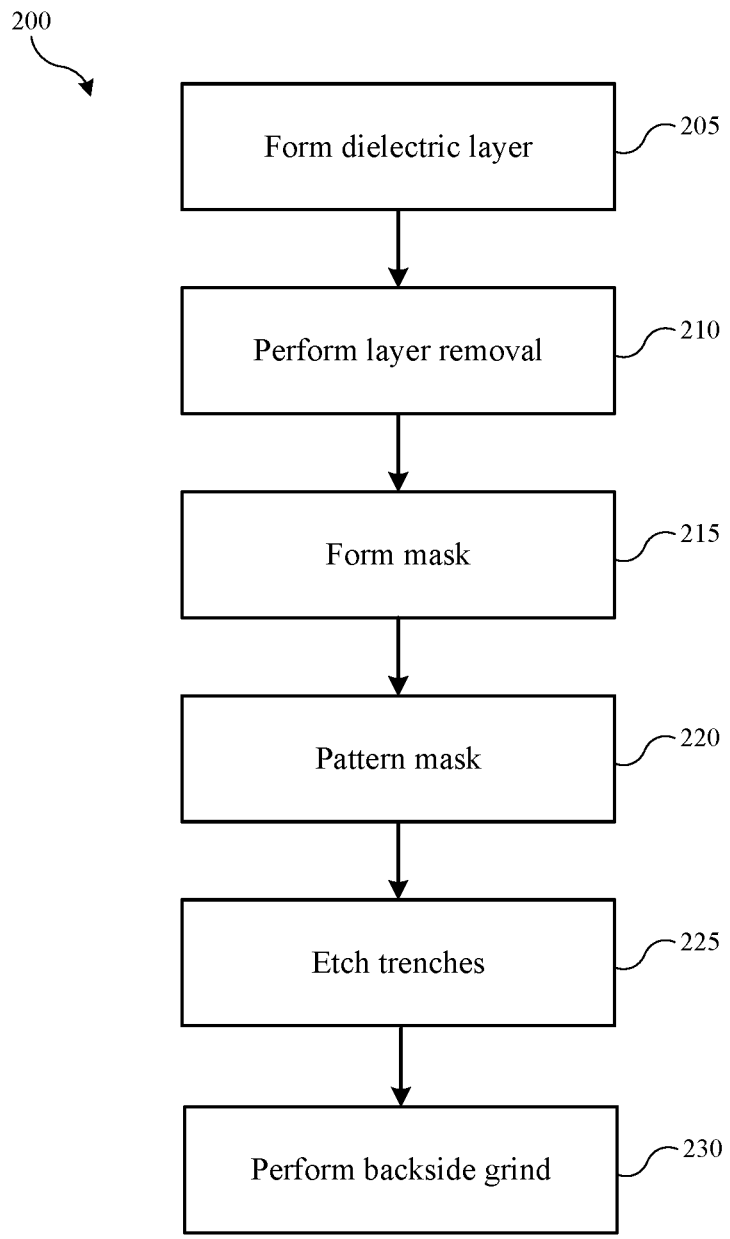
FIG. 2 shows exemplary operations in a method of processing a semiconductor substrate according to some embodiments of the present technology.

System 100, or more specifically chambers incorporated into system 100 or other processing systems, may be used to produce structures according to some embodiments of the present technology. FIG. 2 shows exemplary operations in a method 200 of processing a semiconductor substrate according to some embodiments of the present technology. Method 200 may be performed in one or more processing chambers, such as chambers incorporated in system 100, for example. Method 200 may or may not include one or more operations prior to the initiation of the method, including front-end processing, deposition, etching, polishing, cleaning, or any other operations that may be performed prior to the described operations. The method may include a number of optional operations as denoted in the figure, which may or may not be specifically associated with some embodiments of methods according to the present technology. Method 200 describes operations shown schematically in FIGS. 3A-3F, the illustrations of which will be described in conjunction with the operations of method 200. It is to be understood that the figures illustrate only partial schematic views with limited details, and in some embodiments a substrate may contain any number of semiconductor sections having aspects as illustrated in the figures, as well as alternative structural aspects that may still benefit from any of the aspects of the present technology.

Figure 3A:
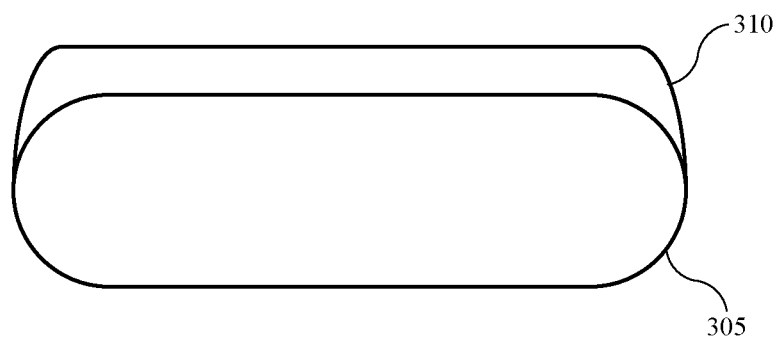
FIGS. 3A-3F show cross-sectional views of substrates being processed according to some embodiments of the present technology.

Method 200 may involve optional operations to develop the semiconductor structure to a particular fabrication operation. Although in some embodiments method 200 may be performed on a base structure, in some embodiments the method may be performed subsequent other material formation as will be described further below. As illustrated in FIG. 3A, the semiconductor structure may include a semiconductor substrate 305, which may be a silicon material, a germanium material, or some other semiconductor substrate or structure on which additional processing may be performed. Although the substrate may be characterized by any geometry including flat panels, in some embodiments the substrate may be an arcuate semiconductor wafer, which may be characterized by a diameter of 200 mm, 300 mm, 450 mm, or any other dimension. The substrate may be characterized by a beveled edge extending circumferentially about the substrate.

At operation 205, method 200 may include forming a dielectric layer 310 overlying the substrate 305. The dielectric material may be an oxide or a nitride or any number of materials, including silicon, carbon, or any transition metal. The dielectric material may be formed across the substrate surface, including along an interior region, an edge region, and along a bevel of the substrate. Although illustrated as being formed on only one side of the substrate, it is to be understood that the formation may occur on backside surfaces of the substrate as well, in embodiments encompassed by the present technology. The dielectric layer may be formed to any thickness, including greater than or about 100 nm, greater than or about 250 nm, greater than or about 500 nm, greater than or about 750 nm, greater than or about 1.0 µm, greater than or about 2.0 µm, or more. However, as will be explained below, depending on whether the layer may be or include one or more bilayers of material, the layer may be formed to a thickness to control film stress, which may cause damage to the substrate if the stress exceeds a threshold. Accordingly, in some embodiments, the layer may be maintained at less than or about 5 µm, less than or about 4 µm, less than or about 3 µm, less than or about 2 µm, or less. The process to deposit or form the dielectric layer may include any number of deposition processes including thermal oxidation, atomic-layer deposition, chemical vapor deposition, plasma-enhanced chemical vapor deposition, or any other process to form or develop a layer of dielectric material on the semiconductor substrate.

As explained previously, the dielectric layer 310 may be used to provide an edge protection while additional processing is being performed. For example, processing may continue within an interior region of the substrate, or devices for which access may be needed, such as for bonding, may be set to occur. Accordingly, in some embodiments, method 200 may include a removal of the dielectric layer 310 at operation 210. The removal may include any type of removal including plasma enhanced etching, reactive ion etching, wet etching, or chemical-mechanical polishing. In order to maintain an edge region of the layer of dielectric material, in some embodiments an edge exclusion removal may be performed. The edge exclusion may be performed to substantially or essentially remove the layer of dielectric material 310 from an interior region of the semiconductor substrate, while at least partially maintaining an amount of the layer of dielectric material along an exterior region of the semiconductor substrate.

Because the layer of dielectric material may be characterized by a thickness of several hundred nanometers or more, the process may include a chemical-mechanical polishing operation. Additionally, in some embodiments the removal may include multiple removal operations, such as an initial chemical-mechanical polishing operation, followed by a second selective wet etch or dry etch to fully clear an interior region of the semiconductor substrate, while limiting damage to the underlying substrate. While many chemical-mechanical polishing operations may be performed with the goal of perfect planarity across the substrate, the present technology may perform the polishing operation in a counterintuitive manner, which may allow an edge exclusion removal to be performed. For example, chemical-mechanical polishing may include a number of tunable aspects, which facilitate increasing planarity of the removal, or adjusting to better remove non-planar features on a wafer. Modification of the slurry may affect chemical removal and selectivity, and pressure of the membrane and retaining ring may affect mechanical removal. The present technology may increase a mechanical aspect of the removal by increasing one or both of the membrane pressure and/or the retaining ring pressure.

Figure 3B:
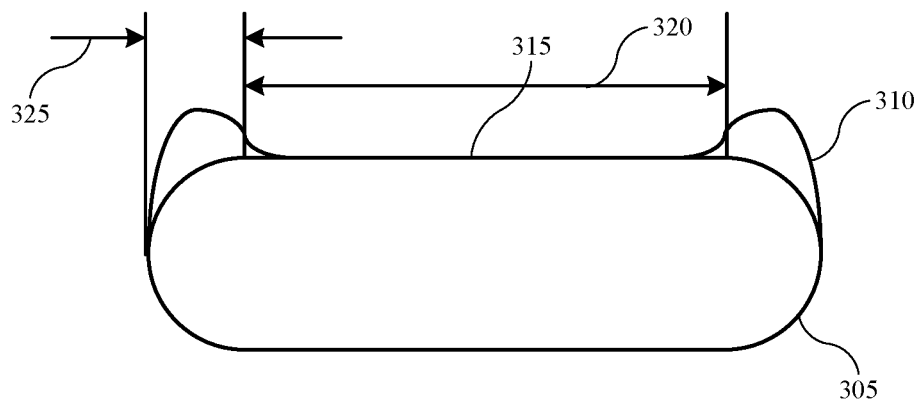

The retaining ring is often located externally to an outer edge of the semiconductor substrate. By increasing pressure on the retaining ring, the substrate may be pulled away from the polishing pad. Similarly, by increasing pressure along the membrane in specific portions of the interior region, removal may proceed. This may allow removal to be performed within the interior region, while reducing or limiting removal along an exterior region. As shown in FIG. 3B, the removal may occur substantially or completely within the interior region 315, while a portion of dielectric material 310 is maintained along an exterior of the substrate, such as along an edge region and/or a bevel. By substantially removed may mean a removal that may be greater than or about 90%, greater than or about 95%, greater than or about 98%, greater than or about 99%, or more, and may include full removal of the dielectric material within the interior layer. Additionally, for any lesser removal than complete removal, additional removal processes may be performed for final removal, which may further protect the underlying substrate from scratching. Similarly, the amount maintained on the edge region and/or bevel may be greater than or about 50%, and may be greater than or about 55%, greater than or about 60%, greater than or about 65%, greater than or about 70%, greater than or about 75%, greater than or about 80%, greater than or about 85%, greater than or about 90%, greater than or about 95%, greater than or about 97%, greater than or about 99%, or the dielectric material may be essentially or completely maintained in embodiments of the present technology.

It is to be understood that the substrate 305 is not intended to be shown to scale, and instead is shown for illustrative purposes. For the non-limiting example of a 300 mm substrate, interior region 320 may extend a radial distance from a center of the substrate of greater than or about 130 mm, and may extend greater than or about 135 mm, greater than or about 140 mm, greater than or about 142 mm, greater than or about 144 mm, greater than or about 145 mm, greater than or about 146 mm, greater than or about 147 mm, greater than or about 148 mm, greater than or about 149 mm, or more. Similarly, exterior region 325 may extend a radial distance from an exterior edge of the substrate of greater than or about 0.5 mm, and may extend a distance greater than or about 1.0 mm, greater than or about 1.5 mm, greater than or about 2.0 mm, greater than or about 2.5 mm, greater than or about 3.0 mm, or more. However, in some embodiments, to maintain the dielectric material within the edge region, the dielectric material may be maintained a radial distance from the exterior edge of less than or about 10 mm, and may be maintained less than or about 9 mm, less than or about 8 mm, less than or about 7 mm, less than or about 6 mm, less than or about 5 mm, less than or about 4 mm, less than or about 3 mm, or less. As shown, and in some examples, removal at a boundary between the interior region and exterior region may not be complete, and an amount of overlap may occur, while the remainder of the interior region is clear of the dielectric material 310. The overlap may extend into the interior zone less than or about 10% of a distance across the interior zone, and may extend less than or about 9% of the distance, less than or about 8% of the distance, less than or about 7% of the distance, less than or about 6% of the distance, less than or about 5% of the distance, less than or about 4% of the distance, less than or about 3% of the distance, less than or about 2% of the distance, less than or about 1% of the distance, or less. The amount of dielectric material encroaching on the interior region as a thickness may also be limited to a percentage less than or about any as noted for the overlap in length.

Figure 3C:
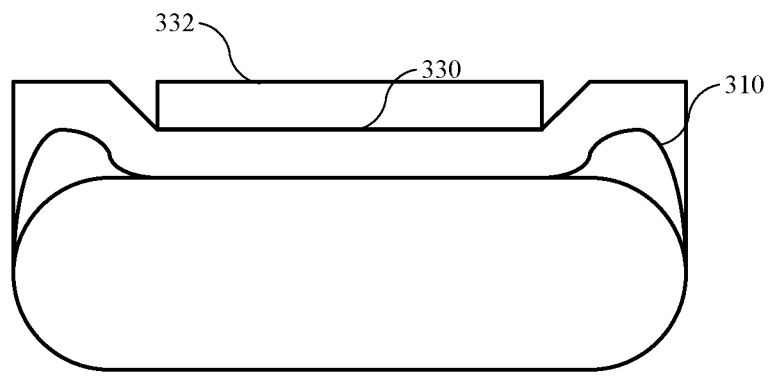

For some processes encompassed by the present technology, method 200 may include limited or no further operations prior to backside grinding, or any other use of the edge protected substrate. In some embodiments including additional formation processes, such as deep trench formation as described above, method 200 may include additional operations in which the dielectric material 310 is used to protect the edge of the substrate during processing. For example, at operation 215, a mask material 330 may be formed across the substrate, which may be patterned in lithography to isolate regions for via or trench formation. As shown in FIG. 3C, the mask material may contact or otherwise overlap the dielectric material 310, which may be maintained across the edge region of the substrate. The mask material may be any number of materials that may allow selective removal of substrate material, and may include a dielectric material including any of the materials described above. In some embodiments, the mask material and the dielectric material may be or include the same material, such as silicon oxide as a non-limiting example. At operation 220, mask material 330 may be patterned, such as with photoresist 332, followed by processing of the mask to expose regions of the semiconductor substrate.

Figure 3D:
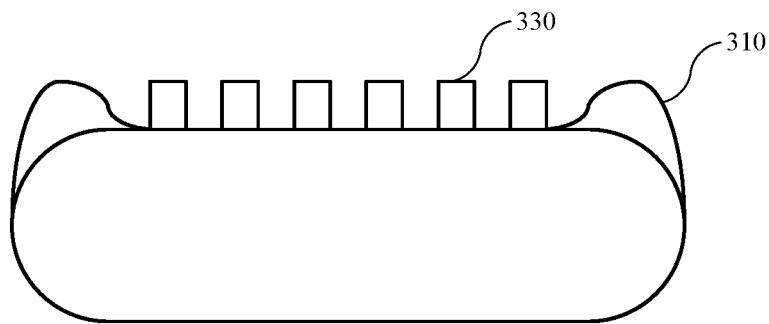

As explained previously, photolithography may include a process called edge bead removal, in which edge and bevel portions of the resist are removed to facilitate processing in the lithography chamber. However, this exposure may cause mask material to be removed on exterior regions of the substrate, which may lead to the open area removal at the edge, far edge, and bevel regions as described above. Accordingly, photoresist may only remain within an interior portion of the substrate as shown. The present technology may overcome this deficiency by including the dielectric material along the edge region, which may remain after patterning the mask, and which may ensure the edge region and bevel region remain protected. As shown in FIG. 3D, a number of openings may be formed in mask 330 to allow patterning on the substrate, which may expose one or more portions of a first surface of the semiconductor substrate. Although removal of resist may cause some or all of the mask material to be removed from the edge region of the substrate, the remaining dielectric material 310 may protect this region.

At operation 225, one or more trenches 335, vias, or structures may be formed through the opened mask, and into the semiconductor substrate. Trenches or apertures according to the present technology may be characterized by depth and aspect ratios greater than conventional technologies, which may be in part to the edge protection afforded. For example, aspect ratios, or a depth-to-width ratio may be greater than or about 10, greater than or about 20, greater than or about 30, greater than or about 40, greater than or about 50, greater than or about 60, or more. Additionally, trenches or features may be formed to a depth of greater than or about 10 μm, and may be formed to a depth of greater than or about 15 μm, greater than or about 20 μm, greater than or about 25 μm, greater than or about 30 μm, greater than or about 35 μm, greater than or about 40 μm, greater than or about 45 μm, greater than or about 50 μm, greater than or about 55 μm, greater than or about 60 μm, greater than or about 65 μm, greater than or about 70 μm, greater than or about 75 μm, greater than or about 80 μm, greater than or about 85 μm, greater than or about 90 μm, greater than or about 95 μm, greater than or about 100 μm, or greater. Conventional technologies characterized by exposed edge regions may have substrate losses at the edge regions of greater than or about double, triple, quadruple, or greater due to the open area and lack of mask material due to patterning constraints.

Figure 3E:
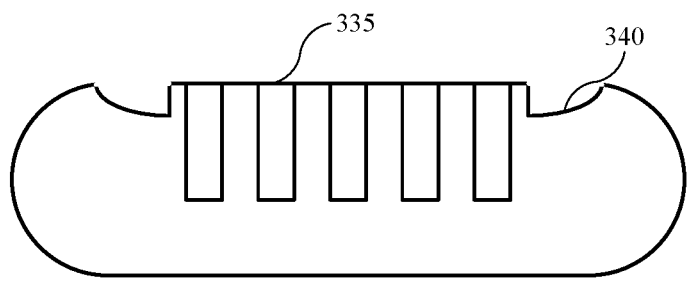

As shown in FIG. 3E, depending on the depth of the feature formed, an amount of substrate removal at the edge regions may occur once the edge protection is overcome during the etch. As illustrated, the substrate removal at the edge region may be characterized by a profile 340, which may have a greater amount of loss at the interface between the edge region and the interior region, and may be characterized by lower loss further outward radially. Accordingly, by incorporating an edge protection material, a loss at the edge region may be less than or about 50% of a depth of the feature formed within the interior region, and may be less than or about 45% of the depth of the feature, less than or about 40% of the depth of the feature, less than or about 35% of the depth of the feature, less than or about 30% of the depth of the feature, less than or about 25% of the depth of the feature, less than or about 20% of the depth of the feature, less than or about 15% of the depth of the feature, less than or about 10% of the depth of the feature, less than or about 5% of the depth of the feature, or less. In some embodiments, areas of the edge, far edge, or bevel may be substantially, essentially, or completely maintained.

Figure 3F:
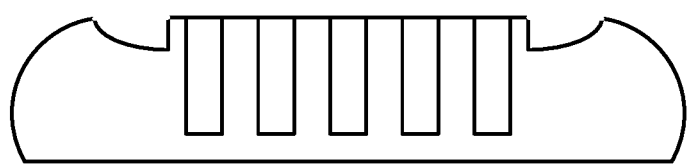

Some embodiments of the present technology may include backside grinding or wafer thinning in subsequent operations. It is to be understood that any number of formation or processing operations may occur prior to the back side grinding. As shown in FIG. 3F, operation 230 may include reducing a thickness of the substrate to a thickness that may be less than or about 500 µm, less than or about 400 µm, less than or about 300 µm, less than or about 200 µm, or less. Because conventional technologies may include edge damage to a depth of well over 100 µm, such wafer thinning operations may be impossible without causing substrate breakage and yield loss. However, because the edge regions of the substrate in the present technology may be substantially protected, additional wafer-level reductions may be performed.

As noted previously, depending on the thickness of the feature to be formed within the substrate, additional edge protection may be produced. However, as the thickness of the edge protection increases, the stress imparted on the substrate may become significant. Accordingly, the present technology additionally includes operations to produce a more stress neutral dielectric layer, which may include one or more bilayers of material, and which may afford further protection of substrates during processing according to embodiments of the present technology.

Figure 4:
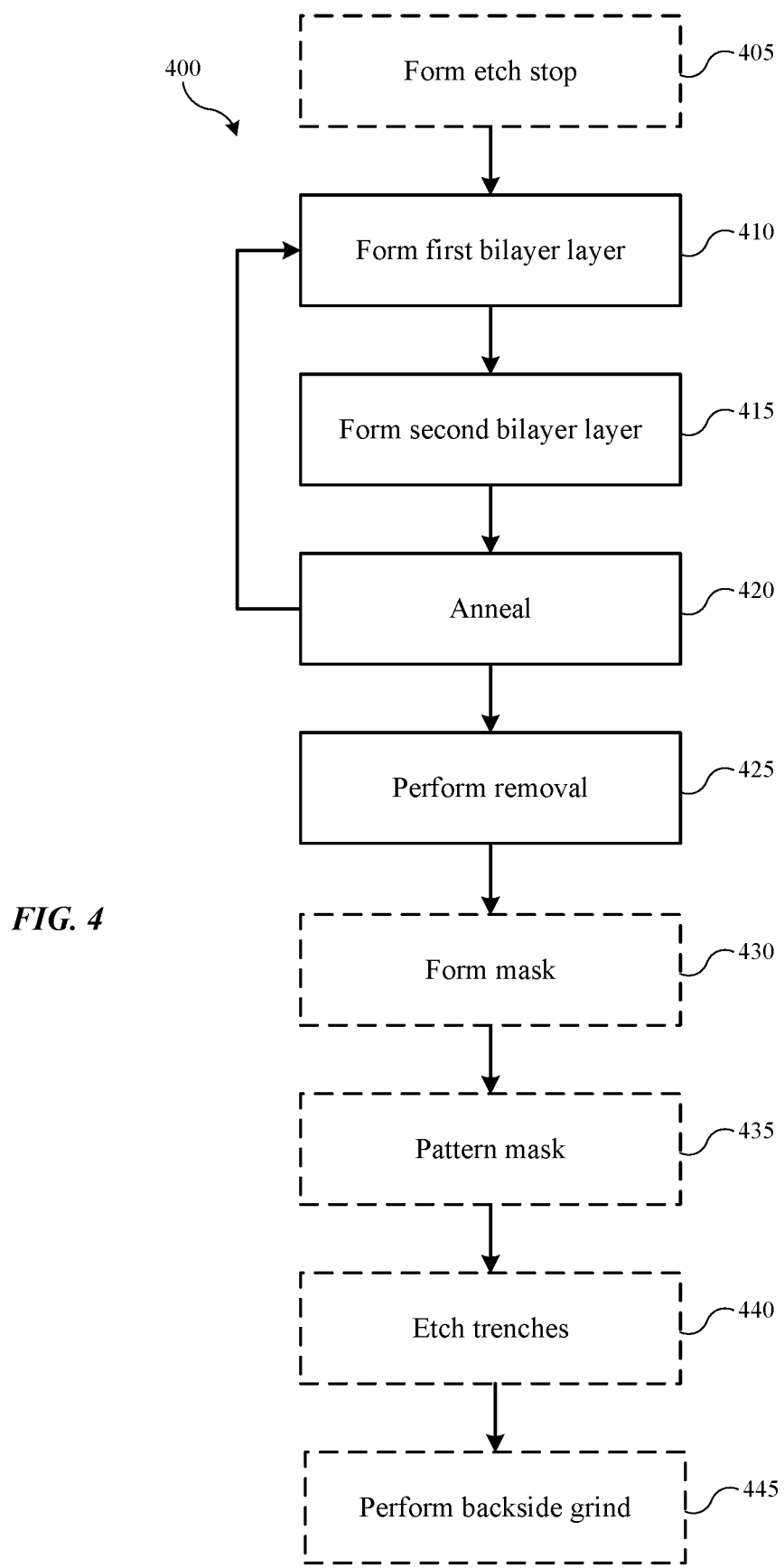
FIG. 4 shows exemplary operations in a method of processing a semiconductor substrate according to some embodiments of the present technology.

FIG. 4 shows exemplary operations in a method 400 of processing a semiconductor substrate according to some embodiments of the present technology. Method 400 may be performed in one or more processing chambers, such as chambers incorporated in system 100, for example. Method 400 may or may not include one or more operations prior to the initiation of the method, including front-end processing, deposition, etching, polishing, cleaning, or any other operations that may be performed prior to the described operations. The method may include a number of optional operations as denoted in the figure, which may or may not be specifically associated with some embodiments of methods according to the present technology. Method 400 describes operations shown schematically in FIGS. 5A-5F, the illustrations of which will be described in conjunction with the operations of method 400. It is to be understood that the figures illustrate only partial schematic views with limited details, and in some embodiments a substrate may contain any number of semiconductor sections having aspects as illustrated in the figures, as well as alternative structural aspects that may still benefit from any of the aspects of the present technology.

Method 400 may include any or all of the processes described above in method 200, and may illustrate and describe additional details that may be performed in method 200 as well. The components discussed in FIG. 5 may include any of the materials, aspects, or characteristics of any material or feature described above. For example, in some embodiments, dielectric layer 310 described above in regards to method 200 may include one or more bilayers of dielectric material for producing a low stress layer of material. Accordingly, it is to be understood that any aspect of method 200 may apply to method 400, and any aspect of method 400 may apply to method 200 in embodiments of the present technology.

Figure 5A:
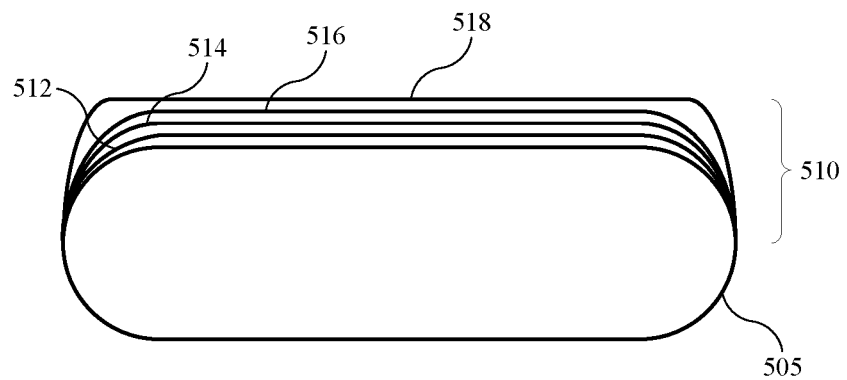
FIGS. 5A-5F show cross-sectional views of substrates being processed according to some embodiments of the present technology.

Method 400 may include forming a number of layers of material over a semiconductor substrate 505 as illustrated in FIG. 5A. Any number of layers of material may be included as will be described below, and in combination, these layers of material may produce a layer of dielectric material 510 as illustrated, and which may include any number of internal layers, including bilayers, in embodiments of the present technology. In some embodiments, an etch stop layer may be formed across the substrate, which may be used to limit or control mechanical polishing or over etching, which may lead to substrate scratching. In some embodiments the etch stop layer may be or include nitride, while the dielectric material may also include oxide, which may be selectively removed relative to nitride. To facilitate formation of the nitride, in some embodiments an initial oxide layer 512 may be formed across the surface of substrate 505. The oxide may be formed in any number of ways as previously described, and may include a rapid thermal oxidation in a wet or dry environment. Subsequently, etch stop layer 514 may be formed at optional operation 405. As noted, etch stop layer 514 may be formed along the semiconductor substrate surface, and may be a material, such as a dielectric material, different from a dielectric material in the other layers of dielectric material 510. As one non-limiting example, etch stop layer 514 may be silicon nitride, and may be a low stress silicon nitride, which may limit effects on the substrate.

At operation 410, method 400 may include forming a layer of dielectric material, which may be or include a first layer of a bilayer. As shown in FIG. 5A, layer 516 may be formed overlying the etch stop layer, and may be a first layer, such as a first oxide layer. Subsequently, at operation 415, a second layer of the bilayer may be formed, and as shown in FIG. 5A, layer 518 may be formed overlying the first layer of the bilayer. Dielectric layers 516 and 518 may be formed together, and may be formed by any process as previously described. However, the materials may be characterized by opposite stresses in embodiments of the present technology. For example, either layer, such as layer 516 in one example, may be characterized by a tensile film stress, while the other layer, such as layer 518 in the same example, may be characterized by a compressive film stress. It is to be understood that the layers may also be formed with the reverse stress characteristics. These stresses may produce a bilayer characterized by a more neutral stress, which may limit an effect on the substrate. To produce the opposite stresses, different deposition processes may be performed. Although any process to produce a tensile and/or compressive oxide or dielectric layer may be produced, in some embodiments the tensile film may be produced by a HARP deposition process, which may be a sub-atmospheric chemical vapor deposition process, such as utilizing ozone and tetraethyl orthosilicate. The compressive layer may be produced by a plasma enhanced chemical vapor deposition process, such as utilizing tetraethyl orthosilicate, for example, although other precursors may be used in either deposition.

The layers as illustrated may not adequately represent any specific scale. For example, the initial oxide layer 512, when included, may be characterized by a thickness of less than or about 50 nm, and may be characterized by a thickness of less than or about 45 nm, less than or about 40 nm, less than or about 35 nm, less than or about 30 nm, less than or about 25 nm, less than or about 20 nm, less than or about 15 nm, less than or about 10 nm, less than or about 5 nm, or less. Similarly, the nitride layer may be formed to any thickness, which may allow the film to operate as a mechanical and/or chemical etch stop layer. For example, the layer may be characterized by a thickness of less than or about 250 nm, and may be characterized by a thickness of less than or about 200 nm, less than or about 150 nm, less than or about 100 nm, less than or about 50 nm, or less. The thickness of etch stop layer 514 may be greater as the number of bilayers included may be increased, as will be described further below. The bilayer layers 516 and 518 may be characterized by greater thicknesses than the other films and may be characterized by any thickness as previously described.

For example, the layers together may be characterized by any thickness noted above, and the individual layers may be characterized by a thickness greater than or about 500 nm, and may be characterized by a thickness of greater than or about 600 nm, greater than or about 700 nm, greater than or about 800 nm, greater than or about 900 nm, greater than or about 1000 nm, greater than or about 1100 nm, greater than or about 1200 nm, greater than or about 1300 nm, greater than or about 1400 nm, greater than or about 1500 nm, greater than or about 1600 nm, greater than or about 1700 nm, greater than or about 1800 nm, greater than or about 1900 nm, greater than or about 2000 nm, greater than or about 2100 nm, greater than or about 2200 nm, greater than or about 2300 nm, greater than or about 2400 nm, greater than or about 2500 nm, or more. In embodiments the layers may be characterized by a similar or different thickness. For example, in some embodiments the second layer may be characterized by a thickness greater than or about 120% of the thickness of the first layer, and may be characterized by a thickness greater than or about 140% of the thickness of the first layer, greater than or about 160% of the thickness of the first layer, greater than or about 180% of the thickness of the first layer, greater than or about 200% of the thickness of the first layer, or more.

Subsequent formation of the bilayer, an anneal may be performed to improve the quality of the bilayer, and densify the film. The anneal may be performed at a temperature of greater than or about 500° C., and may be performed at a temperature of greater than or about 600° C., greater than or about 700° C., greater than or about 800° C., greater than or about 900° C., greater than or about 1000° C., greater than or about 1100° C., greater than or about 1200° C., or higher. The anneal may be performed for a time period of greater than or about 5 minutes, and may be performed for a time period of greater than or about 10 minutes, greater than or about 15 minutes, greater than or about 20 minutes, greater than or about 25 minutes, or more. Either layer of the bilayer, and the bilayer film, both prior to or subsequent anneal may be characterized by a film stress, either tensile or compressive, of less than or about 1000 MPa, and may be characterized by a film stress of less than or about 900 MPa, less than or about 800 MPa, less than or about 700 MPa, less than or about 600 MPa, less than or about 500 MPa, less than or about 400 MPa, less than or about 300 MPa, less than or about 200 MPa, less than or about 100 MPa, or less. By limiting the stress of each layer and the film as a whole, the impact on the substrate may be limited. As illustrated, the bilayer formation and anneal may then be repeated any number of times. As the thickness of the feature to be formed may increase, additional bilayers may be formed to produce a dielectric layer 510 incorporating any number of bilayers in embodiments encompassed by the present technology.

Figure 5B:
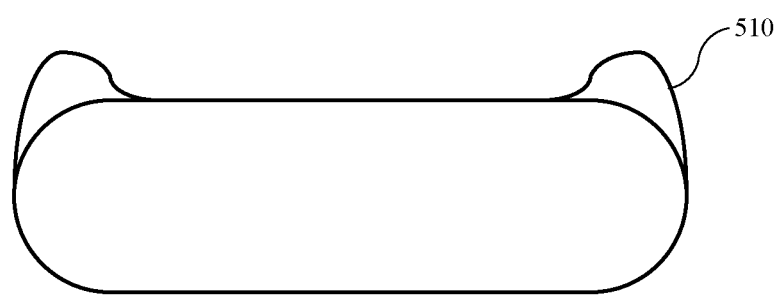

Similarly as explained above, subsequent one or more layers to produce composite dielectric layer 510, an edge exclusion removal process may be performed at operation 425. FIG. 5B may illustrate an exemplary profile subsequent removal, as previously explained above with regard to FIG. 3B. It is to be understood that dielectric layer 510 may include each of the layers as shown in FIG. 5A, and may be maintained to any amount discussed previously. When an etch stop layer is included, a chemical-mechanical polishing operation may be performed as previously described, which may remove the dielectric layer down to the etch stop layer, and may at least partially remove the etch stop layer. Because the process may be performed with more mechanical removal, as described above, the etch stop layer may be used to time the removal and ensure the underlying substrate is not scratched. A subsequent etch, such as a hot phosphoric acid etch, or a selective dry etch, may be performed to remove the residual etch stop layer and any underlying layer, which may expose the substrate at the interior region. Although the secondary etch may cause an amount of undercut of the dielectric layer 510, the remaining material may only be a few dozen nanometers, while the edge protection material may extend for a millimeter or more in some embodiments. Accordingly, significant damage may be avoided while exposing the substrate.

Figure 5C:
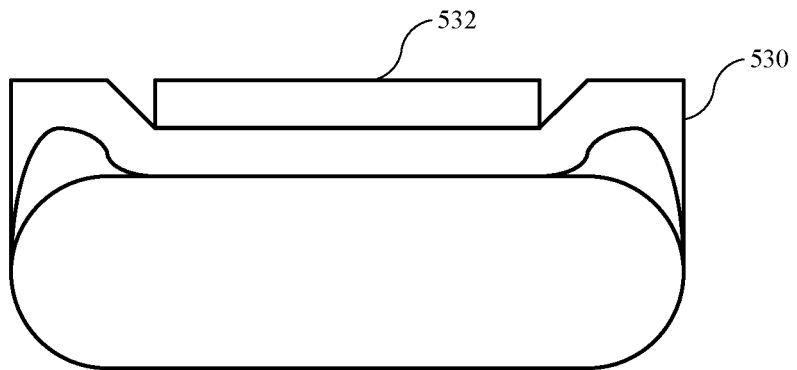
Figure 5D:
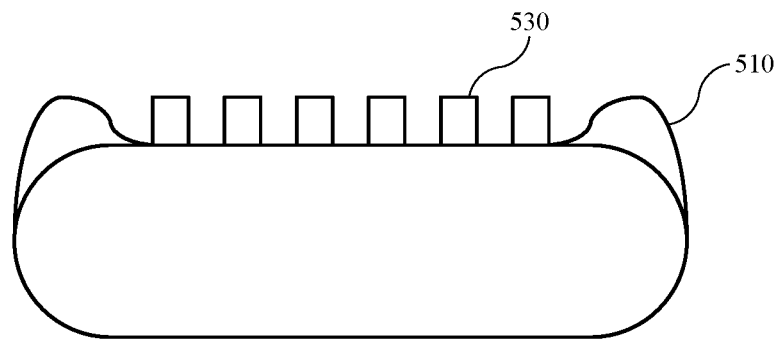

As explained previously, method 400 may be completed, and separate processes may be performed, which may include backside grinding or wafer thinning, as well as bonding or transfer operations utilizing substrate 505 including edge protection material as described. Additionally encompassed embodiments may include producing trenches or vias in the substrate as previously described, and which may include any operation, feature, or characteristic as discussed above with regard to method 200. For example, and as illustrated in FIG. 5C, a mask material 530 may be formed over the substrate at optional operation 430, along with resist material 532. Because of an edge bead removal operation, resist material 532 may not extend across the edge or far edge region of the substrate, or over the bevel. Accordingly, during patterning at optional operation 435, as previously described and as illustrated in FIG. 5D, mask material 530 may be removed along the edge regions of the substrate due to the exposure. However, because of dielectric material 510, including any number of bilayers as discussed above, the edge region may be protected.

Figure 5E:
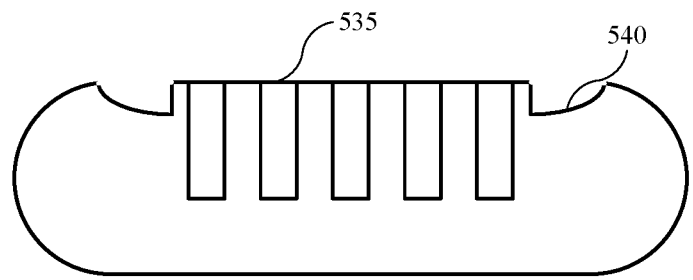
Figure 5F:
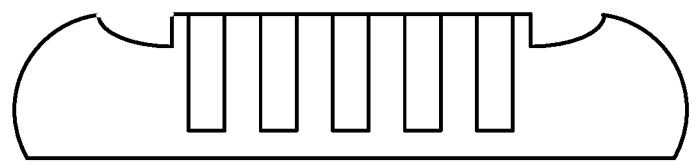

As shown in FIG. 5E, method 400 may include etching one or more trenches 535 or vias into the substrate at optional operation 440, such as with a reactive ion etching process. The features may be characterized by any of the characteristics or properties as explained above. Although an amount of recess 540 may occur in an edge region of the substrate as explained above, the removal may be limited and may be less than the depth of the feature as previously described. In some embodiments, further processing may be performed, followed by a backside grinding operation, which may thin the semiconductor substrate, such as from 775 μm, to less than or about 300 μm, less than or about 200 μm, less than or about 150 μm, or less, as illustrated in FIG. 5F. By utilizing edge protection materials according to some embodiments of the present technology, edge thinning and substrate damage may be limited or prevented.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a bilayer" includes a plurality of such bilayers, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of processing a semiconductor substrate, the method comprising:
    forming a layer of dielectric material on the semiconductor substrate, wherein the dielectric material is formed to a thickness of greater than or about 1 µm;
    performing an edge exclusion removal of the layer of dielectric material;
    forming a mask material on the semiconductor substrate, wherein the mask material contacts the dielectric material at an edge region of the semiconductor substrate;
    patterning an opening in the mask material overlying a first surface of the semiconductor substrate; and
    etching one or more trenches through the semiconductor substrate.

2. The method of processing a semiconductor substrate of claim 1, wherein the edge exclusion removal comprises:
    substantially removing the layer of dielectric material from an interior region of the semiconductor substrate; and
    maintaining an amount of the layer of dielectric material along an exterior region of the semiconductor substrate.

3. The method of processing a semiconductor substrate of claim 2, wherein the dielectric material is maintained about the semiconductor substrate a radial distance of less than or about 10 mm inward from an exterior edge of the semiconductor substrate.

4. The method of processing a semiconductor substrate of claim 1, further comprising, subsequent forming the mask material:
    performing an edge bead removal of the mask material about an edge region of the semiconductor substrate.

5. The method of processing a semiconductor substrate of claim 1, wherein the dielectric material and the mask material comprise an oxide.

6. The method of processing a semiconductor substrate of claim 1, wherein forming a layer of dielectric material comprises:
    forming one or more bilayers of dielectric material, wherein the bilayers of dielectric material comprise:
        a first layer of dielectric material characterized by a tensile stress; and
        a second layer of dielectric material characterized by a compressive stress.

7. The method of processing a semiconductor substrate of claim 1, wherein the one or more trenches are characterized by a depth of greater than or about 10 µm.

8. The method of processing a semiconductor substrate of claim 1, further comprising:
    performing a backside grinding operation, wherein the backside grinding operation reduces a thickness of the semiconductor substrate to less than or about 300 µm.

9. The method of processing a semiconductor substrate of claim 1, wherein etching the one or more trenches reduces a thickness of the semiconductor substrate within the edge region by less than or about 50 µm.

10. A method of processing a semiconductor substrate, the method comprising:
    forming a first layer of dielectric material on the semiconductor substrate, wherein the first layer of dielectric material comprises a bilayer of dielectric material, wherein each layer of the bilayer of dielectric material is characterized by a thickness of greater than or about 0.5 µm, and wherein the bilayer of dielectric material including:
        a first layer of dielectric material characterized by a tensile stress, and
        a second layer of dielectric material characterized by a compressive stress;
    annealing the bilayer of dielectric material; and
    performing an edge exclusion removal of the bilayer of dielectric material, wherein the edge exclusion removal comprises:
        substantially removing the bilayer of dielectric material from an interior region of the semiconductor substrate, and
        maintaining an amount of the bilayer of dielectric material along an exterior region of the semiconductor substrate.

11. The method of processing a semiconductor substrate of claim 10, wherein the bilayer of dielectric material is maintained about the semiconductor substrate a radial distance of less than or about 10 mm inward from an exterior edge of the semiconductor substrate.

12. The method of processing a semiconductor substrate of claim 10, further comprising, subsequent annealing the first layer of dielectric material:

forming a second layer of dielectric material on the bilayer of dielectric material, wherein the second layer of dielectric material comprises a second bilayer of dielectric material, the second bilayer of dielectric material including:
a first layer of dielectric material characterized by a tensile stress, and
a second layer of dielectric material characterized by a compressive stress.

13. The method of processing a semiconductor substrate of claim 10, further comprising, prior to forming the bilayer of dielectric material:
forming an etch stop layer along the semiconductor substrate.

14. The method of processing a semiconductor substrate of claim 10, further comprising:
forming a mask material on the semiconductor substrate, wherein the mask material contacts the bilayer of dielectric material at an edge region of the semiconductor substrate;
patterning an opening in the mask material overlying a first surface of the semiconductor substrate; and
etching one or more trenches through the semiconductor substrate.

15. The method of processing a semiconductor substrate of claim 14, further comprising, subsequent forming the mask material:
performing an edge bead removal of the mask material about an edge region of the semiconductor substrate.

16. The method of processing a semiconductor substrate of claim 10, wherein each layer of the bilayer of dielectric material is characterized by a thickness of greater than or about 0.5 μm.

17. The method of processing a semiconductor substrate of claim 10, further comprising:
performing a backside grinding operation, wherein the backside grinding operation reduces a thickness of the semiconductor substrate to less than or about 300 μm.

* * * * *